(12) United States Patent
Beck et al.

(10) Patent No.: US 8,093,150 B2
(45) Date of Patent: Jan. 10, 2012

(54) METHODS OF MANUFACTURING SEMICONDUCTOR DEVICES AND STRUCTURES THEREOF

(75) Inventors: Michael Beck, Poughkeepsie, NY (US); Erdem Kaltalioglu, Newburgh, NY (US)

(73) Assignee: Infineon Technologies AG, Munich (DE)

( * ) Notice: Subject to any disclaimer, the term of this patent is extended or adjusted under 35 U.S.C. 154(b) by 899 days.

(21) Appl. No.: 11/523,207

(22) Filed: Sep. 19, 2006

(65) Prior Publication Data

US 2008/0070404 A1    Mar. 20, 2008

(51) Int. Cl.
*H01L 21/4763* (2006.01)

(52) U.S. Cl. .................. 438/638; 438/706; 257/E21.571

(58) Field of Classification Search ............... None
See application file for complete search history.

(56) References Cited

U.S. PATENT DOCUMENTS

| | | | | |
|---|---|---|---|---|
| 5,486,424 | A * | 1/1996 | Nakato et al. | 428/451 |
| 6,627,093 | B1 * | 9/2003 | Froment et al. | 216/18 |
| 2006/0148264 | A1 * | 7/2006 | Kim et al. | 438/723 |
| 2007/0275556 | A1 * | 11/2007 | Bietsch et al. | 438/640 |

OTHER PUBLICATIONS

"AR™40/41/46 193 nm Anti-Reflectants," http://electronicmaterials.rohmhaas.com/products/brochures/AR40.pdf, downloaded Sep. 19, 2006, 1 p., Rohm and Haas Company, Philadelphia, PA.

"Opto-Electronic Materials," http://www.jsr.co.jp/jsr_e/epd/hide_01.html, downloaded Sep. 19, 2006, 4 pp., JSR Corporation, Japan.

"Product Finder: AR19 ArF Anti-Reflectant," http://electronicmaterials.rohmhaas.com/products/default.asp?product=AR19+ArF+Anti%2Dreflectant, downloaded Sep. 19, 2006, 1 p., Rohm and Haas Company, Philadelphia, PA.

* cited by examiner

*Primary Examiner* — Zandra Smith
*Assistant Examiner* — Pamela E Perkins
(74) *Attorney, Agent, or Firm* — Slater & Matsil, L.L.P.

(57) ABSTRACT

Methods of manufacturing semiconductor devices are disclosed. A preferred embodiment comprises a method of manufacturing a semiconductor device, the method including providing a workpiece, disposing an etch stop layer over the workpiece, and disposing a material layer over the etch stop layer. The material layer includes a transition layer. The method includes patterning the material layer partially with a first pattern, and patterning the material layer partially with a second pattern. Patterning the material layer partially with the second pattern further comprises simultaneously completely patterning the material layer with the first pattern.

29 Claims, 5 Drawing Sheets

METHODS OF MANUFACTURING SEMICONDUCTOR DEVICES AND STRUCTURES THEREOF

TECHNICAL FIELD

The present invention relates generally to the fabrication of semiconductor devices, and more particularly to methods of preventing resist poisoning.

BACKGROUND

Generally, semiconductor devices are manufactured by depositing many different types of material layers over a semiconductor workpiece or wafer. The material layers are patterned using lithography. The material layers typically comprise thin films of conductive, semiconductive, and insulating materials that are patterned and etched to form integrated circuits (IC's).

For many years in the semiconductor industry, silicon dioxide ($SiO_2$), which typically has a dielectric constant (k) of about 3.9, was often used as an insulating material between conductive features of semiconductor devices. However, as the demand for smaller and faster circuits has continued to drive the need for smaller feature sizes and denser circuitry, lower dielectric constant insulating materials are being used for insulating material layers of integrated circuits, which have a dielectric constant of less than 3.9.

Low dielectric constant insulating materials often comprise porous materials that permit substances and materials to permeate through the insulating materials, which can result in a loss of insulating properties of the material and other problems from contamination. Photoresist or resist is a photosensitive material used in lithography that is used as a mask to pattern material layers of semiconductor devices. Some substances can pass through low dielectric constant insulating materials and result in a problem referred to as "resist poisoning," which can occur during a patterning process, e.g., during lithography. If certain substances or materials permeate through the porous low dielectric constant insulating material, damage can be caused to the photoresist, resulting in an inaccurate pattern transfer.

Thus, what are needed in the art are improved integration schemes for the patterning of low dielectric constant insulating materials in semiconductor device manufacturing.

SUMMARY OF THE INVENTION

These and other problems are generally solved or circumvented, and technical advantages are generally achieved, by preferred embodiments of the present invention, which provide novel methods and integration schemes that prevent photoresist poisoning.

In accordance with a preferred embodiment of the present invention, a method of manufacturing a semiconductor device includes providing a workpiece, disposing an etch stop layer over the workpiece, and disposing a material layer over the etch stop layer. The material layer includes a transition layer. The method includes patterning the material layer partially with a first pattern, and patterning the material layer partially with a second pattern. Patterning the material layer partially with the second pattern further comprises simultaneously completely patterning the material layer with the first pattern.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
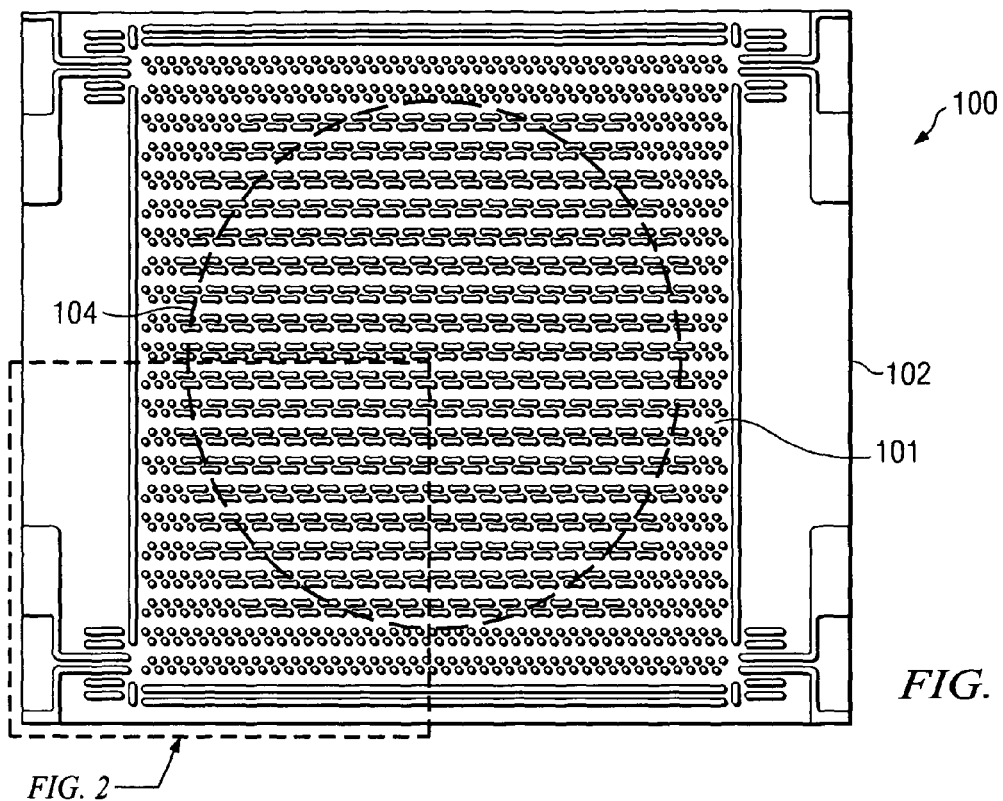
FIG. 1 shows a top view of a semiconductor device that exhibits device failures due to resist poisoning.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely methods of forming trenches for dual damascene processes used to form conductive features, such as conductive lines and vias. Embodiments of the present invention may also be utilized in the patterning of material layers in other applications and for other types of materials formed using dual damascene techniques, for example.

For many years, material layers of semiconductor devices were formed by depositing a layer of material, and removing portions of the layer of material using lithography techniques to pattern the layer of material, which is often referred to as a subtractive etch process. However, some materials such as copper are difficult to etch using a subtractive etch process. Thus, damascene techniques are often used to form some material layers of semiconductor devices.

In a damascene technique to form conductive features, as an example, an insulating material layer is deposited over a substrate or workpiece, and the insulating material layer is patterned using lithography, forming trenches within the insulating material layer. For example, a layer of photoresist may be formed over the insulating material layer, the layer of photoresist may be patterned and developed, and the layer of photoresist is then used as a mask while exposed portions of the insulating material layer are etched away. The layer of photoresist is removed, and a conductive material is deposited over the insulating material layer to fill the patterns or trenches in the insulating material layer. A chemical-mechanical polish (CMP) process is then used to remove excess conductive material from the top surface of the insulating material layer, leaving the conductive material within the patterned insulating material. The conductive material forms conductive features such as conductive lines, vias, and contact pads, as examples.

In a single damascene process, a single layer of insulating material is patterned with a single pattern, forming a layer of conductive lines or vias, for example. In a dual damascene process, an insulating material is patterned twice; first with a first pattern and second with a second pattern. One of the patterns may comprise vias and the other pattern may comprise conductive lines, for example. The location of the first and second patterns may coincide in certain locations, e.g., to form a via beneath a conductive line, for example. The first and second patterns within the insulating material are simultaneously filled with a conductive material in a dual damascene process.

A problem with some conventional dual damascene processes is that often, the insulating materials used are porous; e.g., when low dielectric constant (k) insulating materials are used. Cap layers and etch stop layers are often used below and/or above the low dielectric constant (k) insulating materials in inter-level dielectric (ILD) layers to prevent diffusion of substances through the porous low k insulating materials. Some cap layers or etch stop layers may comprise materials that are damaging to photoresist if the material reaches the photoresist during the patterning transfer of the first pattern and/or the second pattern in a dual damascene process.

For example, some etch stop layers comprise nitrogen, which causes damage to photoresist. One etch stop material often used is SiCN, e.g., such as n-BLOk by Applied Materials, as an example. If a SiCN etch stop material is formed as a bottom layer beneath an insulating material, and a first pattern is formed completely through the insulating material, exposing the SiCN etch stop material, then when a layer of photoresist is deposited over the insulating material patterned with the first pattern, and a second pattern is later formed in the layer of photoresist, nitrogen from the SiCN may move upwardly through the first pattern in the insulating material during the patterning of the layer of photoresist with the second pattern. Furthermore, the nitrogen or nitrogen-containing gas specimens from the SiCN may move through the insulating material if the insulating material is permeable to the nitrogen-containing specimens during the patterning of the second pattern, for example, if the insulating material comprises a low-k material deposited by chemical vapor deposition (CVD). The nitrogen can poison the layer of photoresist in portions of the workpiece, resulting in the second pattern not being formed in some regions of the semiconductor device in the upper portion of the insulating material, resulting in device failures and reduced yields.

Figure 2:
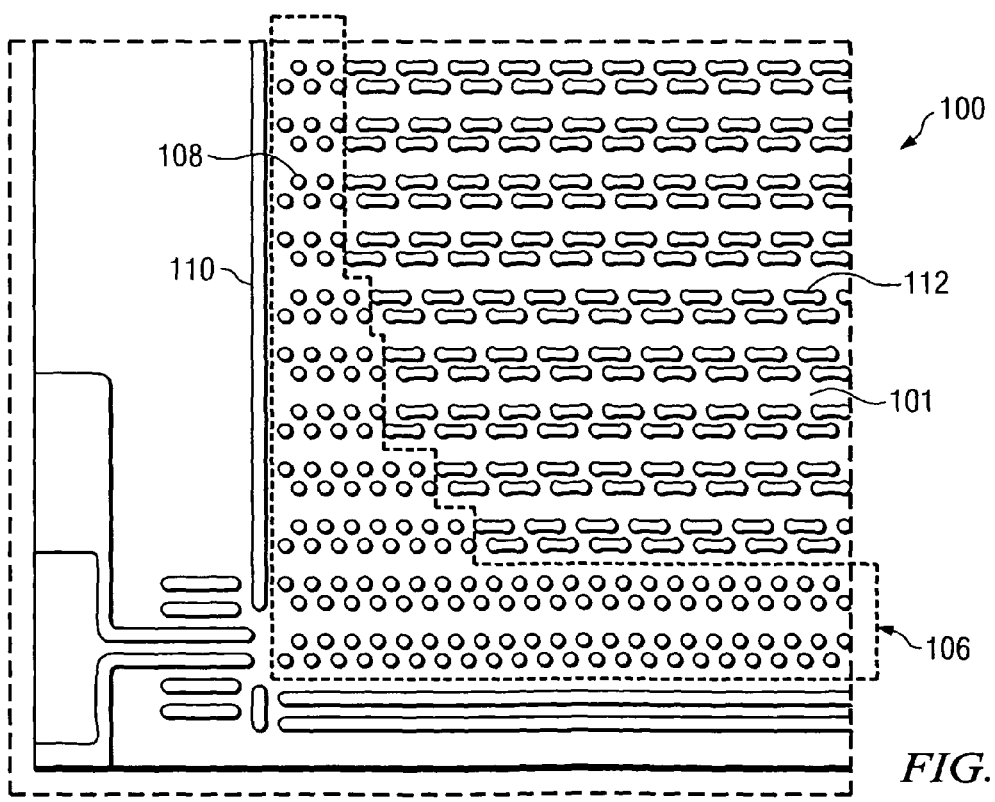
FIG. 2 shows a more detailed view of a corner of the semiconductor device shown in FIG. 1.

FIG. 1 shows a top view of a semiconductor device 100 that exhibits resist poisoning, which is an undesired consequence of a lithography process that results in device failures. A workpiece, an individual die, or a group of die is shown, comprising an edge region 102 and a central region 104. FIG. 2 shows a more detailed view of an edge region 102 and a corner of the semiconductor device 100 shown in FIG. 1. A conductive material layer 108/110/112 is shown that has been formed using a dual damascene technique. In this example, the first pattern formed in an insulating material 101 comprises patterns for vias 108, and the second pattern formed in the insulating material 101 comprises a pattern for conductive lines 110 and 112 disposed above the first pattern for the vias 108 within the insulating material 101. Some of the conductive lines comprise longer conductive lines 110 that extend along a plurality of vias 108, and other conductive lines comprise shorter conductive lines 112 that extend between two or more vias 108, as shown.

We discovered that resist poisoning tends to occur at the corners and edges of semiconductor devices 100, or regions bordering areas with fewer or only a few vias 108, e.g., at defect regions 106. In the defect regions 106, the conductive lines 112 that should extend between vias 108 (e.g., above the vias 108, in the insulating material 101) are not formed, due to the nitrogen or nitrogen-containing gas specimens diffusing from an underlying cap layer or etch stop layer tunneling through the vias 108. For example, in a "via first" damascene integration scheme, nitrogen from an underlying etch stop layer comprised of n-BLOk (not shown) may reach the layer of photoresist (also not shown) used to pattern the pattern for conductive lines 112 through the via 108 patterns, which may function as an "exhaust pipe" for the nitrogen. The nitrogen blocks the creation of free acids needed for the development of the layer of photoresist, for example, in the defect regions 106. The missing exhaust outside dense via 108 areas may lead to a higher concentration of nitrogen at the close border of the vias 108, thus leading to a lower acid level, which thus leads to a high amount of resist poisoning at the defect regions 106 at the edges, for example, preventing the formation of the trenches for conductive lines 112.

We also discovered that in some dual damascene integration schemes that use a tri-layer resist, for example, resist poisoning tends to be more of a problem, because the materials used in the tri-layer resist allow nitrogen or nitrogen-containing gas specimens to pass through and poison the resist. If a low temperature oxide (LTO), e.g., comprising $SiO_2$ deposited at a temperature of about 180 to 260 degrees C by CVD, is used as one layer of a tri-layer resist, resist poisoning may be effectively avoided in some applications. However, the use of LTO as a layer in a tri-layer resist is undesirable in some applications, due to increased reflectivity the LTO causes in the tri-layer resist. The increased reflectivity caused by the use of LTO in a tri-layer resist limits the minimum feature size, e.g., preventing the implementation of such tri-layer resists for use with increased numerical aperture lithography tools that may be patterned using such a tri-layer resist, for example.

Figure 3:
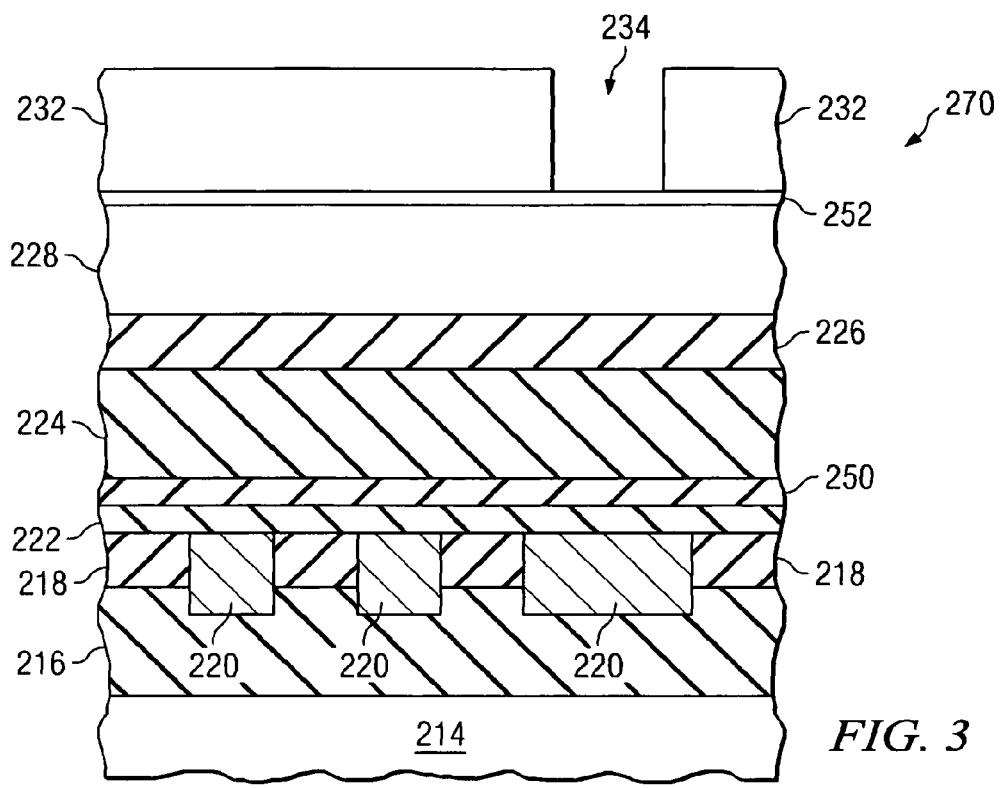
FIGS. 3 through 9 show cross-sectional views of a method of manufacturing a semiconductor device in accordance with a preferred embodiment of the present invention at various stages of manufacturing.

Embodiments of the present invention provide novel integration schemes and methods of preventing resist poisoning in dual damascene processes. FIGS. 3 through 9 show cross-sectional views of a method of manufacturing a semiconductor device in accordance with a preferred embodiment of the present invention at various stages of manufacturing. Referring to FIG. 3, a semiconductor device 270 is shown. The semiconductor device 270 comprises a workpiece 214. The workpiece 214 may include a semiconductor substrate comprising silicon or other semiconductor materials covered by an insulating layer, for example. The workpiece 214 may also include other active components or circuits, not shown. The workpiece 214 may comprise silicon oxide over single-crystal silicon, for example. The workpiece 214 may include other conductive layers or other semiconductor elements, e.g., transistors, diodes, etc. Compound semiconductors, GaAs, InP, Si/Ge, or SiC, as examples, may be used in place of silicon. The workpiece 214 may comprise a silicon-on-insulator (SOI) substrate, for example.

An optional insulating layer 216/218 is formed over the workpiece 214. The insulating layer 216/218 may comprise $SiO_2$, SiON, $Si_3N_4$, a low dielectric constant material, or multiple layers or combinations thereof, as examples, although alternatively, the insulating layer 216/218 may comprise other materials. The insulating layer 216/218 shown comprises two layers; however, alternatively, the insulating layer 216/218 may comprise a single layer or three or more layers, for example.

A plurality of optional conductive lines 220 may be formed in the insulating layer 216/218, as shown. The plurality of conductive lines 220 may comprise copper, aluminum, or other conductive materials. One or more liners or seed layers may be formed in the patterned insulating layer 216/218 before the patterned insulating layer 216/218 is filled with a conductive material, for example, not shown. Alternatively, the conductive lines 220 may be formed using a subtractive etch process, for example (not shown). The plurality of conductive lines 220 and the insulating layer 216/218 may comprise a first metallization layer and/or a second metallization layer of the semiconductor device 270, for example, although the conductive lines 220 may also comprise other metallization layers of the semiconductor device 270.

An etch stop layer 222 is formed over the workpiece 214, or over the conductive lines 220 and over the top surface of the insulating layer 216/218, if present. The etch stop layer 222 preferably comprises SiCN, for example, although the etch stop layer 222 may alternatively comprise other insulating materials, such as $Si_3N_4$, SiON, or other materials. The etch stop layer 222 preferably comprises n-BLOk by Applied Materials, as an example, in one embodiment, although the etch stop layer 222 may also comprise other materials. The etch stop layer 222 preferably comprises a thickness of about 100 nm or less, although alternatively, the etch stop layer 222 may comprise other dimensions.

The etch stop layer 222 preferably comprises a material that is etchable selective to a subsequently deposited ILD layer 224/250 material, for example. The etch stop layer 222 may comprise a material that is more mechanically strong than the ILD layer 224/250, in some embodiments, for example.

In some embodiments, the etch stop layer 222 comprises a material that would deleteriously affect a subsequently deposited photoresist 232, shown disposed over the top surface of the semiconductor device 270 in FIG. 3. The potentially damaging material within the etch stop layer 222 may comprise nitrogen, as an example, although the etch stop layer 222 may comprise other materials that may negatively impact the photoresist 232. In particular, the etch stop layer 222 may comprise a substance that has the potential to deleteriously affect a photosensitive material such as a layer of photoresist.

An interlevel dilectric (ILD) layer 224/250 is formed over the etch stop layer 222, as shown. The ILD layer 224/250 preferably comprises an ILD material 224 comprising a low dielectric constant (k) material 224 in some embodiments, for example. The ILD material 224 preferably comprises $SiO_2$, SiCOH, tetra ethyl oxysilane (TEOS), pSiCOH, multiple layers thereof, or combinations thereof, as examples, although alternatively, the low k material 224 may comprise other materials. The low k material 224 preferably comprises a dielectric constant of about 3.9 or less, for example. The ILD layer 224/250 preferably comprises a thickness of about 3,000 Angstroms or less, for example, although alternatively, the ILD layer 224/250 may comprise other dimensions.

In some embodiments, the ILD layer 224/250 preferably includes a transition layer 250 formed directly over and abutting the etch stop layer 222. The transition layer 250 preferably comprises a different material than the material of the low k material 224. The transition layer 250 preferably comprises a dimension of about ½ or less of the total thickness of the ILD layer 224/250, for example. The transition layer 250 preferably comprises a thickness of about 100 Angstroms or less, and more preferably comprises a thickness of about 30 to 50 Angstroms in some embodiments, for example, although alternatively, the transition layer 250 may comprise other dimensions. The low k material 224 residing above the transition layer 250 preferably comprises a thickness of about 3,000 Angstroms or less, and more preferably comprises a thickness of about 2,000 to 3,000 Angstroms in some embodiments, although alternatively, the low k material 224 may comprise other dimensions. The low k material 224 may comprise a porous material comprising a plurality of pores, in some embodiments, for example.

The transition layer 250 is preferably optimized for a blocking behavior for nitrogen, other contaminants, or materials that may emerge from the etch stop layer 222 and deleteriously affect any photoresist used to pattern a second pattern for conductive lines, for example. For example, in some embodiments, the ILD layer 224/250 is preferably deposited using CVD, which may form a transition layer 250 comprised of a strong blocking material.

The transition layer 250 may comprise an oxide adhesion layer, for example, in some embodiments, that increases the adhesion of the low k material 224 with the underlying etch stop layer 222. The transition layer 250 preferably comprises a material adapted to block the upward movement of the potentially damaging material or substance within the etch stop layer 222 from upwardly rising during later processing of the semiconductor device 270 and reaching the layer of photoresist used to pattern the insulating material 224/250 with a second pattern, for example.

The transition layer 250 may comprise a LTO, in one embodiment, for example. The LTO may be deposited by exposing the workpiece to about 200 to 800 standard cubic centimeters per minute (s.c.c.m.) of $SiH_4$ and 6,000 to 12,000 s.c.c.m. of $N_2O$ at a power of about 400 to 600 Watts, at a pressure of about 2 to 3 Torr, and at a temperature of about 80 to 150 degrees C., for example, although alternatively, other processing parameters and conditions may also be used to form the transition layer 250 of the ILD layer 224/250. The transition layer 250 may comprise the same type of low k material that the low k material 224 comprises, for example, combined with additional oxygen to improve the barrier properties that prevent diffusion from materials within the etch stop layer 222, for example. The transition layer 250 may be deposited by CVD or other deposition methods, for example.

The transition layer 250 is preferably disposed directly on top of and abutting the etch stop layer 222 so as to prevent the potentially damaging substance from leaving a top surface of the etch stop layer 222, in some embodiments, for example. The transition layer 250 may be adapted to prevent a damaging substance of the etch stop layer 222 from entering and moving through a plurality of pores of the low k material 224 comprising a plurality of pores, for example, thus preventing the damaging substance of the etch stop layer 222 from reaching a layer of photosensitive material and causing resist poisoning in later processing of the semiconductor device 270.

An optional hard mask 226 is formed over the ILD layer 224/250, as shown. The hard mask 226 preferably comprises $SiO_2$, for example, although alternatively, the hard mask 226 may comprise other materials. The hard mask 226 may comprise TEOS or a low k dielectric material, for example. The hard mask 226 preferably comprises a different material than the low k material 224 in some embodiments. The optional hard mask 226 preferably comprises a material that is adapted to be etched selective to the ILD layer 224/250 material, for example, in one embodiment.

Embodiments of the present invention provide novel integration schemes for patterning the hard mask 226, the ILD layer 224/250, and the etch stop layer 222 with a first pattern and a second pattern, using novel dual damascene processes. First, the hard mask 226 and a top portion of the ILD layer 224/250 are patterned with a first pattern for vias. Then, the hard mask 226 and a top portion of the ILD layer 224/250 are patterned with a second pattern for conductive lines, wherein a lower portion of the ILD layer 224/250 is patterned with the first pattern for vias simultaneously, with the patterning of the top portion of the ILD layer 224/250 with the second pattern, to be described further herein.

First, the patterning of a top portion of the ILD layer 224/250 with the first pattern for vias of the novel dual damascene process will be described. A first optical planarization layer (OPL) 228 is formed over the hard mask 226. The first OPL 228 preferably comprises non-fotosensitive chemical (NFC™) by JSR Corporation, as an example, although alternatively, the first OPL 228 may comprise other materials. The first OPL 228 preferably comprises a thickness of about 150 to 350 nm, for example, although alternatively, the first OPL 28 may comprise other dimensions.

A first anti-reflective coating (ARC) 252 is formed over the OPL 228, as shown in FIG. 3. The first ARC 252 preferably comprises SiARC, for example, although alternatively, the first ARC 252 may comprise LTO or other materials, such as AR19 or AR40 by Shipley Co. LLC, as examples. The first ARC 252 may alternatively comprise other organic materials, for example. The first ARC 252 preferably comprises a thickness of about 10 to 50 nm, for example, although alternatively, the first ARC 252 may comprise other dimensions.

A first layer of photoresist 232 is formed over the first ARC 252, as shown in FIG. 3. The first layer of photoresist 232 preferably comprises a photosensitive organic material such as JSR2073 by JSR Corporation, for example, although alternatively, the first layer of photoresist 232 may comprise other materials, such as other commercially available resists. The first layer of photoresist 232 preferably comprises a thickness of about 100 to 250 nm, for example, although alternatively, the first layer of photoresist 232 may comprise other dimensions.

Note that in some embodiments, the first layer of photoresist 232, the first ARC 252, and the first OPL 228 may optionally comprise a single layer of photoresist, not shown.

The first OPL 228, the first ARC 252, and the first layer of photoresist 232 may together comprise a tri-layer resist 228/252/232, for example. In some embodiments, the first OPL 228, the first ARC 252, and the first layer of photoresist 232 preferably comprise spin-on materials that are deposited by spin coating, to provide very planar material layers for the first OPL 228, the first ARC 252, and the first layer of photoresist 232, which improves the lithography process. For example, in some embodiments, the first OPL 228, the first ARC 252, and the first layer of photoresist 232 are preferably not formed using CVD methods.

Figure 4:
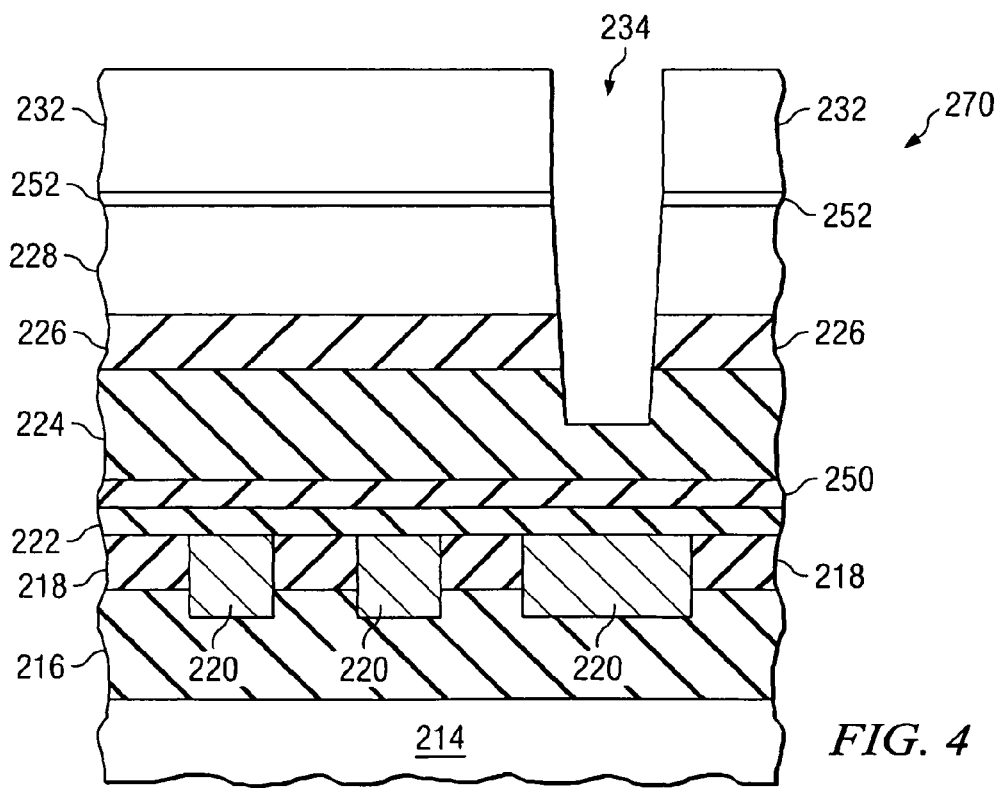

The first layer of photoresist 232 is patterned using a first lithography mask (not shown) with a first pattern 234. The first pattern 234 preferably comprises a pattern for a plurality of vias that will be formed in a lower portion of the ILD layer 224/250, for example. The first layer of photoresist 232 is developed, and then an etch process is used to open the first ARC 252, the first OPL 228, the hard mask 226, and a top portion of the ILD layer 224/250, as shown in FIG. 4. For example, the first layer of photoresist 232 is used as a mask while exposed portions of the first ARC 252, the first OPL 228, the hard mask 226, and a top portion of the low k material 224 of the ILD layer 224/250 are etched away.

Preferably, the etch process to transfer the first pattern 234 to the ILD layer 224/250 only etches away a portion of the low k material 224, and does not etch away any portion of the transition layer 250, as shown in FIG. 4. For example, the first pattern 234 is preferably extended into a top portion of the ILD layer 224/250 by about ⅓ to ½ of the entire thickness of the ILD layer 224/250, in some embodiments. The etch process may comprise a timed reactive ion etch (RIE) process, for example.

The first OPL 228, the first ARC 252, and the first layer of photoresist 232 are removed, e.g., using an ash process. A top portion of the hard mask 226 may be removed during the removal of the first OPL 228, the first ARC 252, and the first layer of photoresist 232 (not shown).

Figure 5:
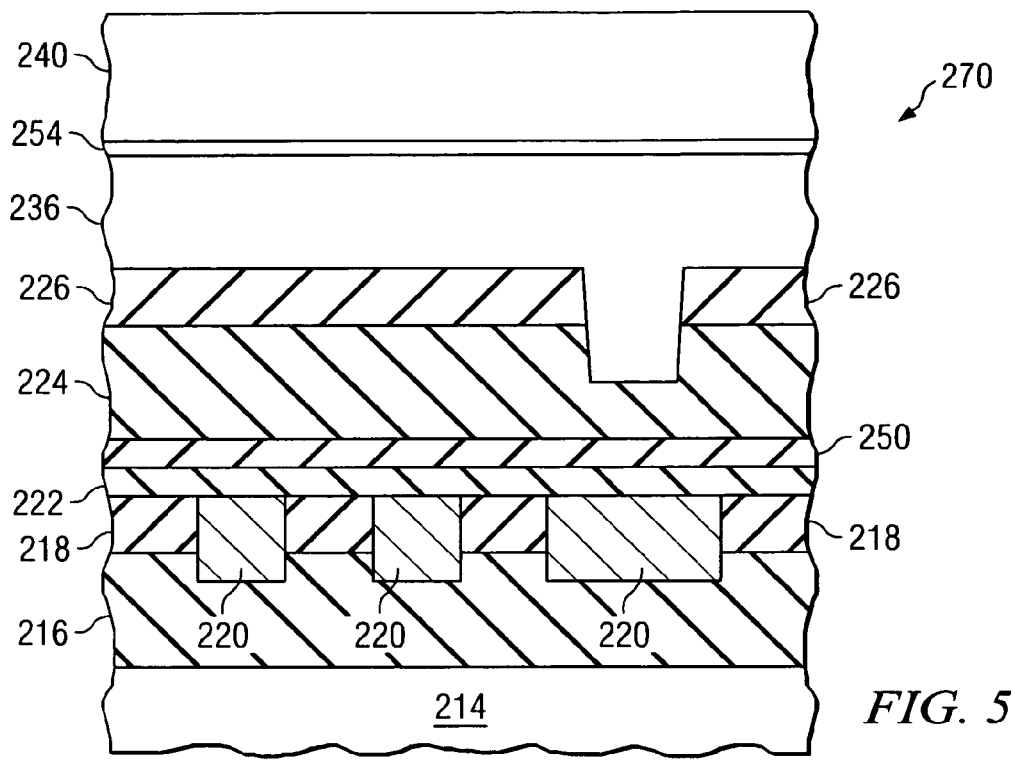

Next, the patterning of a top portion of the ILD layer 224/250 with the second pattern for conductive lines of the novel dual damascene process of embodiments of the present invention will be described. A second OPL 236 is formed over the hard mask 226, as shown in FIG. 5. The second OPL 236 preferably comprises similar materials and dimensions as described for the first OPL 228 shown in FIGS. 3 and 4, for example, although alternatively, the second OPL 236 may comprise other materials.

A second antireflective coating (ARC) 254 is formed over the OPL 236, as shown in FIG. 5. The second ARC 254 preferably comprises SiARC, for example, although alternatively, the second ARC 254 may comprise other materials, such as AR19 or AR40 by Shipley Co. LLC, as examples. The second ARC 254 may alternatively comprise other organic materials, for example. The second ARC 254 preferably comprises similar materials and dimensions as described for the first ARC 252, for example, although alternatively, the second ARC 254 may comprise different materials and dimensions than the first ARC 252.

A second layer of photoresist 240 is formed over the second ARC 254, as shown in FIG. 5. The second layer of photoresist 240 preferably comprises similar materials and dimensions as described for the first layer of photoresist 232, for example, although alternatively, the second layer of photoresist 240 may comprise different materials and dimensions than the first layer of photoresist 232.

The second OPL 236, the second ARC 254, and the second layer of photoresist 240 may together comprise a tri-layer resist 236/254/240, for example. In some embodiments, the second OPL 236, the second ARC 254, and the second layer of photoresist 240 preferably comprise spin-on materials, to provide very planar material layers for the second OPL 236, the second ARC 254, and the second layer of photoresist 240, which improves the lithography process. For example, in some embodiments, the second OPL 236, the second ARC 254, and the second layer of photoresist 240 are preferably not formed using CVD methods.

Note that in some embodiments, the second layer of photoresist 240, the second ARC 254, and the second OPL 236 may optionally comprise a single layer of photoresist, not shown.

Figure 6:
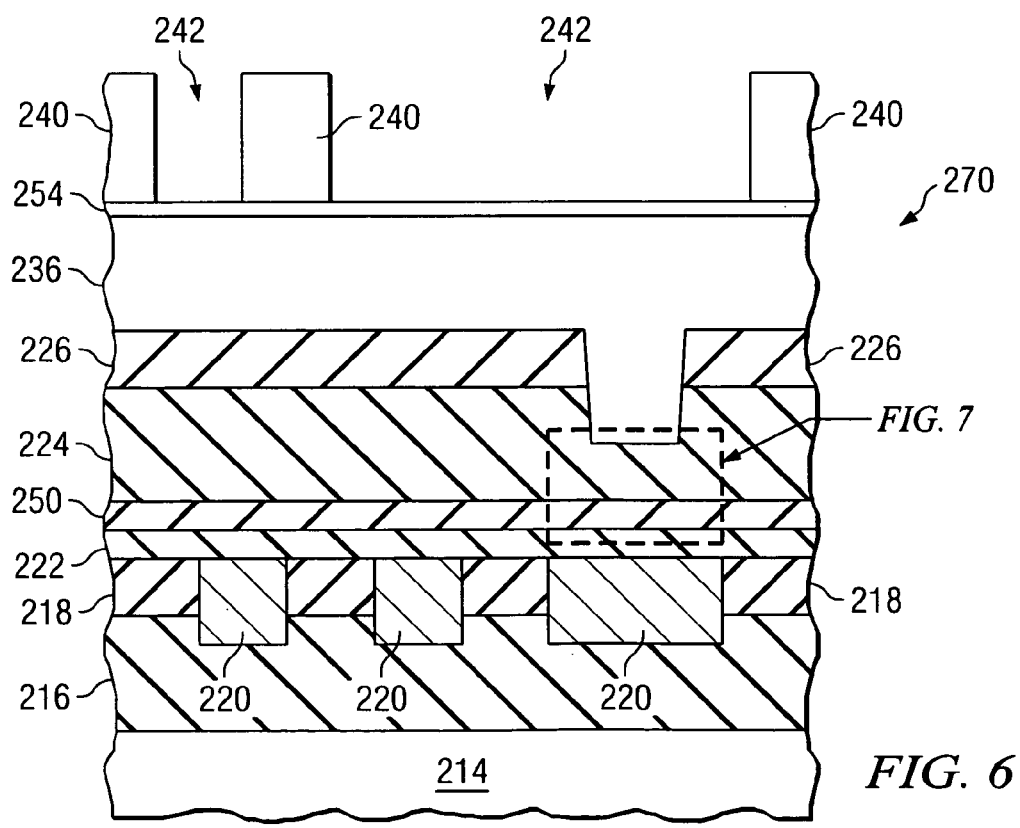

The second layer of photoresist 240 is patterned using a second lithography mask (not shown) with a second pattern 242, as shown in FIG. 6. The second pattern 242 preferably comprises a pattern for a plurality of conductive lines that will be formed in an upper portion of the ILD layer 224/250, for example. The second layer of photoresist 240 is then developed.

Figure 7:
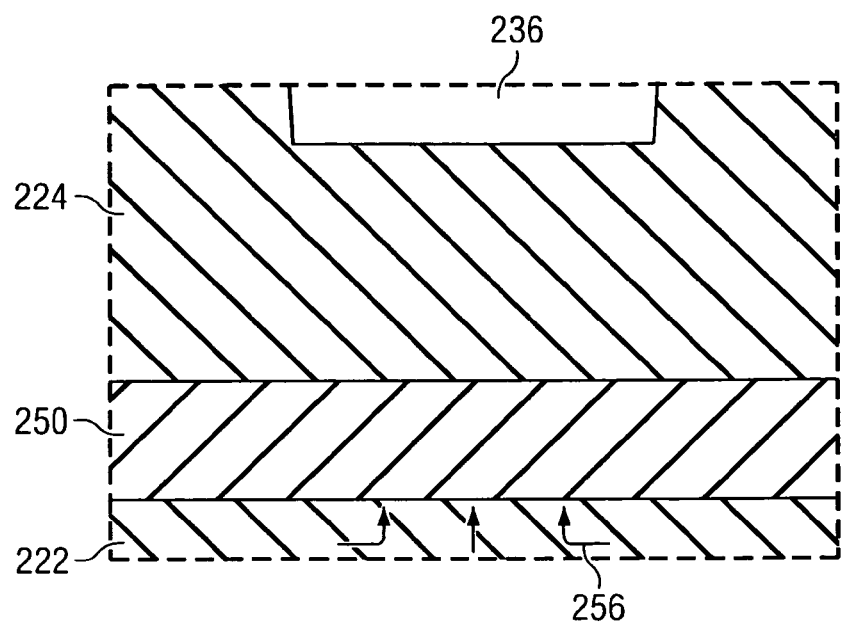

Advantageously, because a portion of the ILD layer 224/250 resides above the etch stop layer 222 during the development of the second layer of photoresist 240, nitrogen and/or other contaminants, substances, or materials that may damage or deleteriously affect the second layer of photoresist 240 are prevented from being released from the etch stop layer 222, as shown in a more detailed view in FIG. 7. For example, the development and/or exposure process of the second layer of resist 240 (see FIG. 6) may cause the nitrogen or other contaminants or materials in the etch stop layer 222 to rise upwardly within etch stop layer 222, as shown at 256. The transition layer 250 of the ILD layer 224/250 prevents the release of the nitrogen or other contaminants, substances, or materials which may damage the second layer of photoresist 240 and cause resist poisoning, for example.

Figure 8:
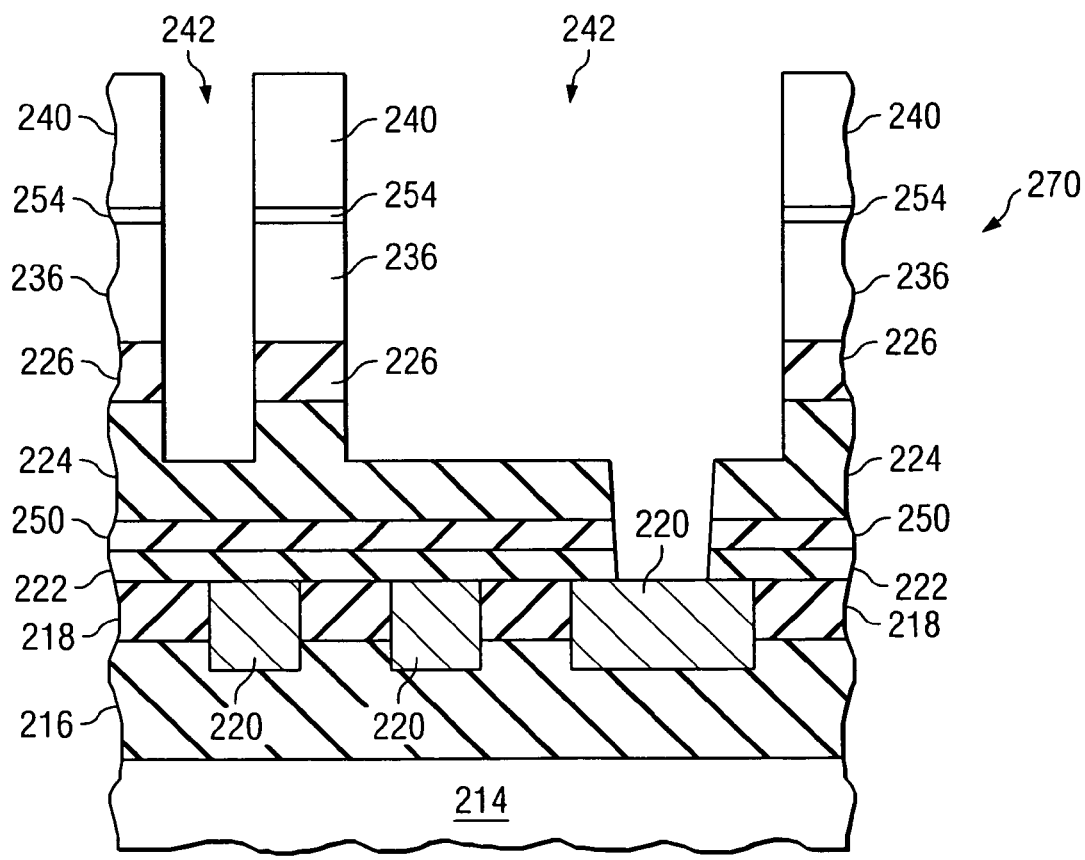

Referring again to FIG. 6, after the development of the second layer of photoresist 240, an etch process is used to open the second ARC 254, the second OPL 236, the hard mask 226, and a top portion of the ILD layer 224/250, as shown in FIG. 8. The etch process may comprise a RIE process that is timed or is adapted to stop when the etch stop layer 222 is reached, e.g., using an end point detection process. For example, the second layer of photoresist 240 is used as a mask while exposed portions of the second ARC 254, the second OPL 236, the hard mask 226, and a top portion of the low k material 224 of the ILD layer 224/250 are etched away.

Advantageously, because the level of the low k material 224 has been lowered in the first etch process, e.g., in the shape of the first pattern 234, the via pattern (e.g., the first pattern 234) is transferred to the lower portion of the ILD layer 224/250 during the second etch process to pattern the ILD layer 224/250 with the second pattern 242, as shown in FIG. 8. Thus, patterning the insulating material layer 224/250 and hard mask 226 partially with the second pattern 242 further comprises simultaneously completely patterning the ILD layer 224/250 with the first pattern 234, as shown in FIG. 8.

The second pattern 242 is preferably extended into a top portion of the ILD layer 224/250, e.g., into a top portion of the low k material 224, as shown in FIG. 8. In some embodiments, for example, the second pattern 242 is preferably extended into the ILD layer 224/250 by about 1/3 to 1/2 of the entire thickness of the ILD layer 224/250, although the depth of the second pattern may comprise other dimensions.

Preferably, the etch stop layer 222 is exposed after the transfer of the second pattern 242 to the ILD layer 224/250. Then, the etch stop layer 222 is opened, e.g., using an etch process adapted to remove the etch stop layer 222 material, exposing at least one conductive line 220 in the underlying insulating material layers 216 and 218, as shown in FIG. 8. The second layer of photoresist 240, the second ARC 254, and the second OPL 236 are removed, e.g., using an ash process. A top portion of the hard mask 226 may be removed during the removal of the second layer of photoresist 240, the second ARC 254, and the second OPL 236, for example, not shown.

Figure 9:
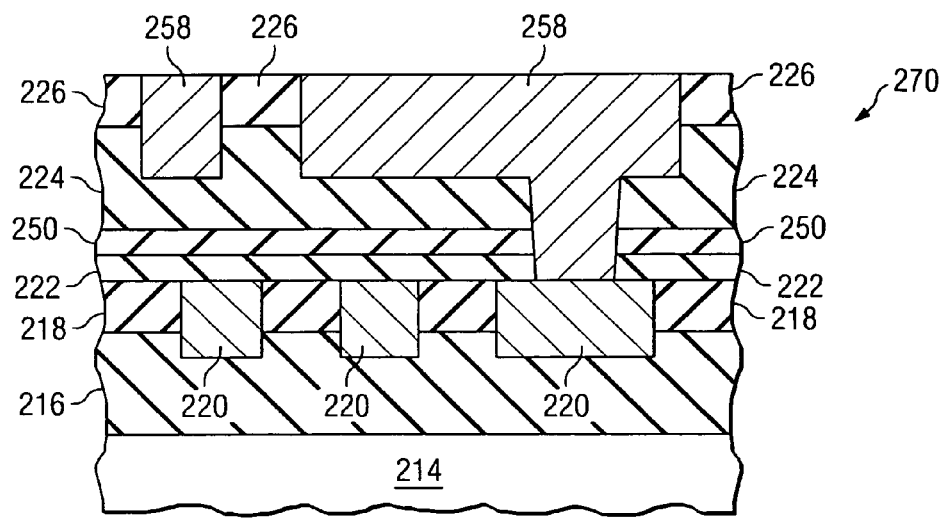

A conductive material 258 is deposited or formed over the patterned hard mask 226 and the patterned ILD layer 224/250, as shown in FIG. 9. The conductive material 258 may also comprise a semiconductive material 258, for example. The conductive material 258 may comprise copper, aluminum, other conductive materials or combinations thereof, polysilicon, other semiconductive materials, or combinations of semiconductive materials and conductive materials, as examples. Excess conductive material 258 is removed from over the hard mask 226, e.g., using a CMP process and/or etch process, for example, not shown, leaving the conductive material 258 within the patterned ILD layer 224/250 and the hard mask 226, as shown in FIG. 9.

The integration scheme may be repeated for additional metallization layers of the semiconductor device 270, not shown. If the lower metallization layers are not present, e.g., if the conductive lines 220 and the insulating layer 216/218 are not previously formed before the etch stop layer 222 is formed (see FIG. 9), then the dual damascene structure comprised of the conductive material 258, the etch stop layer 222, the ILD layer 224/250, and the hard mask 226 may comprise a first and second metallization layer of the semiconductor device 270, for example. The vias in the lower portion of the ILD layer 224/250 and the etch stop layer 22 may comprise the first metallization layer and the conductive lines disposed over the vias in the upper portion of the ILD layer 224/250 may comprise the second metallization layer, in these embodiments, for example. The vias in the lower portion of the ILD layer 224/250 may make electrical contact to active areas within the workpiece 214 in these embodiments. Or, the vias may make electrical contact to the underlying conductive lines 220, as shown in FIG. 9.

Processing of the semiconductor device 270 is then continued to complete the device. For example, additional insulating and conductive material layers may be deposited and formed into contact pads and/or bond pads, not shown. Regions of the semiconductor device 270 may be singulated into individual die or groups of die, and packaged into integrated circuits, multi-chip modules, or other types of packaging, for example (not shown).

Figure 10:
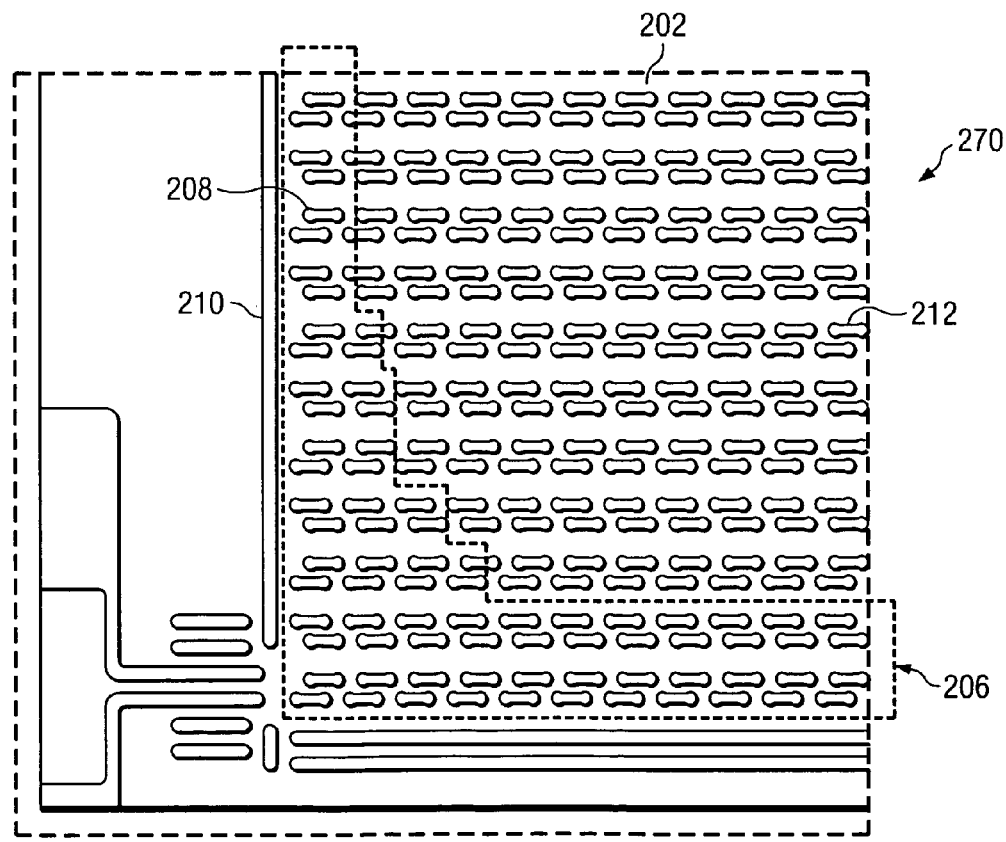
FIG. 10 shows a top view of a semiconductor device manufactured using the method shown in FIGS. 3 through 9.

FIG. 10 shows a top view of a semiconductor device manufactured using the method shown in FIGS. 3 through 9. Like numerals are used for the various elements that were used to describe FIGS. 1 and 2. To avoid repetition, each reference number shown in FIG. 10 is not described again in detail herein. Rather, similar materials x06, x08, x10, x12, etc. . . . are preferably used for the various elements shown as were described for FIGS. 1 through 2, where x=1 in FIGS. 1 and 2 and x=2 in FIG. 10. As an example, conductive lines 210 comprise shorter conductive lines that connect at least two vias 208 in FIG. 10, as described for FIGS. 1 and 2.

Advantageously, the shorter conductive lines 210 are also formed in the edge and corner regions of the semiconductor device 270, which previously were considered defect regions 206 (e.g., defect regions 106 shown in FIGS. 1 and 2 causes by resist poisoning). In FIG. 10, resist poisoning in regions 206 has been prevented using the novel dual damascene process described herein.

Note that in the embodiments shown in FIGS. 3 through 10, a dual damascene process for forming conductive features is shown and described. Alternatively, a dual damascene process may be used to form insulating features, e.g., by depositing a conductive and/or semiconductive material and patterning the conductive and/or semiconductive material using the novel methods described herein, and filling the patterns in the conductive material and/or semiconductive material with an insulating material. Thus, the insulating material layer 224/250 is also referred to herein as a material layer or a first material layer, and the conductive material 258 is also referred to herein as a second material layer, wherein the second material layer preferably comprises a different material than the first material layer or material layer.

Advantages of embodiments of the invention include providing novel dual damascene methods that prevent resist poisoning. The combination of the use of: 1) a novel transition layer 250 disposed over an etch stop layer 222; and 2) a partial etch process to pattern vias, e.g., to transfer the first pattern 234 to the ILD layer 224/250 and hard mask 226, prevents resist poisoning of the second pattern 242 transfer, in accordance with embodiments of the present invention.

A tri-layer resist is preferably used to pattern the first pattern and the second pattern of the novel dual damascene process described herein, in some embodiments. Advantageously, the use of LTO is not required in the tri-layer resists (e.g., tri-layer resist 228/252/232 shown in FIGS. 3 and 4, or tri-layer resist 236/254/240 shown in FIGS. 5 through 6) used to pattern the first pattern 234 and the second pattern 242, respectively, due to the presence of the novel transition layer 250 of the ILD layer 224/250, in accordance with some embodiments of the present invention. Thus, the second OPL 236, the second ARC 254, and the second layer of photoresist 240 of the tri-layer resists 236/254/240 used to pattern the second pattern may all comprise spin-on materials, for example. Thus, a tri-layer resist 236/254/240 having reduced reflectivity may be used, resulting in the ability to use higher numerical aperture lithography tools and thus the ability to pattern smaller feature sizes on the semiconductor device 270.

Alternatively, in other embodiments, LTO may be used in the tri-layer resists (e.g., tri-layer resist 228/252/232 shown in FIGS. 3 and 4, or tri-layer resist 236/254/240 shown in FIGS. 5 through 6) used to pattern the first pattern 234 and the second pattern 242, respectively, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming an etch stop layer over a workpiece;
    forming a transition layer over the etch stop layer;
    forming a material layer over the transition layer;
    etching the material layer partially with a first pattern; and
    etching the material layer partially with a second pattern, wherein etching the material layer partially with the second pattern comprises etching the material layer with the first pattern, wherein the second pattern is different than the first pattern.

2. The method according to claim 1, wherein forming the material layer comprises forming an insulating layer having a dielectric constant of about 3.9 or less.

3. The method according to claim 1, wherein forming the material layer comprises forming a first material layer, further comprising patterning the etch stop layer with the first pattern, and forming a second material layer over the first material layer, filling the first pattern in the etch stop layer and the first material layer and the second pattern in the second material layer with the second material layer.

4. The method according to claim 3, further comprising removing a portion of the second material layer from over the first material layer, leaving the second material layer within the first pattern and the second pattern in the first material layer.

5. The method according to claim 3, wherein forming the first material layer comprises forming an insulating material and wherein forming the second material layer comprises forming a conductive material and/or a semiconductive material.

6. The method according to claim 3, wherein forming the first material layer comprises forming a conductive material and/or a semiconductive material and wherein fanning the second material layer comprises forming an insulating material.

7. A method of manufacturing a semiconductor device, the method comprising:
    forming an etch stop layer over a workpiece;
    forming a first material layer over the etch stop layer, the first material layer including a transition layer formed in a lower part of the first material layer;
    patterning the first material layer partially with a first pattern;
    patterning the first material layer partially with a second pattern using a layer of photosensitive material as a mask, wherein patterning the first material layer partially with the second pattern further comprises simultaneously patterning the first material layer with the first pattern, wherein the transition layer of the first material layer prevents a substance of the etch stop layer from damaging the layer of photosensitive material;
    removing the layer of photosensitive material; and
    forming a second material layer over the first material layer, filling the first pattern and the second pattern in the first material layer.

8. The method according to claim 7, wherein forming the first material layer comprises forming a porous material comprising a plurality of pores, wherein the transition layer prevents the substance of the etch stop layer from entering the plurality of pores of the porous material.

9. The method according to claim 7, wherein forming the first material layer comprises forming a low dielectric constant insulating material, $SiO_2$, SiCOH, tetra ethyl oxysilane (TEOS), pSiCOH, multiple layers thereof, and/or combinations thereof.

10. The method according to claim 7, wherein forming the second material layer comprises forming copper, aluminum, other conductive materials or combinations thereof, polysilicon, other semiconductive materials, or combinations of semiconductive materials and conductive materials.

11. The method according to claim 7, further comprising removing a portion of the second material layer from over the first material layer, leaving the second material layer within the first pattern and the second pattern in the first material layer.

12. The method according to claim 7, wherein the transition layer comprises forming an oxide adhesion layer.

13. The method according to claim 12, wherein forming the oxide adhesion layer comprises forming a low temperature oxide (LTO).

14. The method according to claim 12, wherein forming the oxide adhesion layer comprising the LTO comprises exposing the workpiece to about 200 to 800 standard cubic centimeters per minute (s.c.c.m.) of $SiH_4$ and 6,000 to 12,000 s.c.c.m, of N₂O at a power of about 400 to 600 Watts, at a pressure of about 2 to 3 Ton, and at a temperature of about 80 to 150 degrees C.

15. A semiconductor device manufactured in accordance with the method of claim 7.

16. The method according to claim 8, wherein the transition layer formed in a lower part of the first material layer is in direct contact with the etch stop layer.

17. A method of manufacturing a semiconductor device, the method comprising:
forming an etch stop layer over a workpiece;
forming an insulating material layer over the etch stop layer, the insulating material including a porous low dielectric constant (k) material;
patterning the insulating material layer partially with a first pattern for a plurality of vias using a first masking material; and
patterning the insulating material layer partially with a second pattern for a plurality of conductive lines using a second masking material comprising patterning the insulating material layer with the first pattern for the plurality of vias, wherein the second pattern is different than the first pattern, wherein the first masking material or the second masking material comprises a tri-layer resist, and wherein the tri-layer resist comprises a first layer comprising an optical planarization layer (OPL), a second layer comprising an anti-reflective coating (ARC) disposed over the first layer, and a third layer comprising a layer of photoresist disposed over the second layer.

18. The method according to claim 17, further comprising patterning the etch stop layer with the first pattern for the plurality of vias using the second masking material, removing the second masking material, and depositing a conductive and/or semiconductive material in the patterned insulating material layer.

19. The method according to claim 18, wherein the workpiece comprises at least one active area, and wherein depositing the conductive and/or semiconductive material comprises forming at least one via that makes electrical contact with the at least one active area of the workpiece.

20. The method according to claim 17, wherein each layer of the tri-layer resist is deposited by spin coating.

21. The method according to claim 17, wherein forming the insulating material layer over the etch stop layer further comprises forming a transition layer disposed over the etch stop layer, wherein the etch stop layer comprises a substance having a potential to deleteriously affect the second masking material, and wherein the transition layer prevents the substance from deleteriously affecting the second masking material while patterning the insulating material layer partially with the second pattern for the plurality of conductive lines.

22. A method of manufacturing a semiconductor device, the method comprising:
forming an etch stop layer over a workpiece, the etch stop layer having a top surface and including a substance having a potential to deleteriously affect a photosensitive material;
forming a first material layer over the etch stop layer, the first material layer including a transition layer adapted to prevent the substance from leaving the top surface of the etch stop layer, wherein the transition layer is arranged directly over the etch stop layer, wherein the first material layer is patterned with a first pattern in a lower portion and wherein the first material layer is patterned with a second pattern in an upper portion, the second patter being different than the first pattern; and
forming a second material layer within the first pattern and the second pattern of the first material layer, the second material layer comprising a different material than the first material layer.

23. The method according to claim 22, wherein the substance of the etch stop layer comprises nitrogen.

24. The method according to claim 22, wherein the transition layer of the first material layer comprises an oxide.

25. The method according to claim 22, wherein the transition layer of the first material layer comprises a thickness of about 100 Angstroms or less.

26. The method according to claim 22, wherein the first material layer comprises an insulator, wherein the second material layer comprises a conductor and/or a semiconductor, wherein the first pattern comprises a plurality of vias, and wherein the second pattern comprises a plurality of conductive lines.

27. The method according to claim 22, wherein the first material layer is patterned with a first pattern in a lower portion and wherein the first material layer is patterned with a second pattern in an upper portion comprises patterning the first material layer partially with the first pattern and then patterning the first material layer partially with the second pattern, wherein patterning the first material layer partially with the second pattern further comprises simultaneously patterning the first material layer with the first pattern.

28. A method of manufacturing a semiconductor device, the method comprising:
forming an etch stop layer over a workpiece;
forming a transition layer directly over the etch stop layer;
forming an insulating material layer over the transition layer, the insulating material including a porous low dielectric constant (k) material;
patterning the insulating material layer partially with a first pattern for a plurality of vias using a first masking material; and
patterning the insulating material layer partially with a second pattern for a plurality of conductive lines using a second masking material comprising patterning the insulating material layer with the first pattern for the plurality of vias, wherein the second pattern is different than the first pattern.

29. A method of manufacturing a semiconductor device, the method comprising:
forming an etch stop layer over a workpiece;
forming an insulating material layer over the etch stop layer, the insulating material including a porous low dielectric constant (k) material;
patterning the insulating material layer partially with a first pattern for a plurality of vias using a first masking material; and
patterning the insulating material layer partially with a second pattern for a plurality of conductive lines using a second masking material comprising patterning the insulating material layer with the first pattern for the plurality of vias, wherein the second pattern is different than the first pattern, wherein forming the insulating material layer over the etch stop layer further comprises forming a transition layer disposed over the etch stop layer, wherein the etch stop layer comprises a substance having a potential to deleteriously affect the second masking material, and wherein the transition layer prevents the substance from deleteriously affecting the second masking material while patterning the insulating material layer partially with the second pattern for the plurality of conductive lines.

* * * * *

UNITED STATES PATENT AND TRADEMARK OFFICE
CERTIFICATE OF CORRECTION

PATENT NO. : 8,093,150 B2
APPLICATION NO. : 11/523207
DATED : January 10, 2012
INVENTOR(S) : Beck et al.

Page 1 of 1

It is certified that error appears in the above-identified patent and that said Letters Patent is hereby corrected as shown below:

In Col. 12, line 16, claim 14, delete "fanning" and insert --forming--.
In Col. 13, line 2, claim 14, delete "Ton" and insert --Torr--.

Signed and Sealed this
Third Day of April, 2012

David J. Kappos
*Director of the United States Patent and Trademark Office*